ANODIC OXIDATION

Filed March 2, 1965

WITNESSES:
Leroy M. Gorman
James F. Young

INVENTORS
Paul F. Schmidt and
Norbert J. Roney.
BY
C. L. Menzemer
ATTORNEY

United States Patent Office 3,377,258

Patented Apr. 9, 1968

3,377,258

ANODIC OXIDATION

Paul F. Schmidt, Allentown, and Norbert J. Roney, Pittsburgh, Pa., assignors to Westinghouse Electric Corporation, Pittsburgh, Pa., a corporation of Pennsylvania Filed Mar. 2, 1965, Ser. No. 436,600

8 Claims. (Cl. 204—15)

The present invention relates to the production of oxide masks on semiconductor wafers, and more particularly to a method for simultaneously forming aligned oxide masks on opposite sides of an N-type silicon wafer.

As is known, oxide films can be grown on silicon wafers by means of an anodization process. Such films are formed by making the silicon wafer the anode in a suitable electroylte; an inert material such as platinum is used as the cathode; and a direct current potential applied between the wafer and cathode.

While anodic oxides can be grown on a P-type silicon wafer by simply immersing the wafer in a suitable electrolyte and applying an electrical potential between the wafer and an inert cathode within the electroylte, growth of anodic oxide films on N-type silicon depends upon the availability of minority carriers (i.e., holes) at the surface. No appreciable oxide growth will occur in complete darkness below the breakdown strength of the silicon-electrolyte surface barrier, provided the surface recombination-regeneration velocity is low. Oxide growth, therefore, can be controlled on N-type silicon wafers by localized illumination.

In certain cases, it is necessary or desirable to provide an integrated semiconductor device in which the semiconductor body serves as the base of the transistor, and the emitter and collector are diffused in from the opposite sides. Such an arrangement is possible, for example, with silicon dendrite webs, which can be grown only a fraction of a mil thick, and on which further thinning down in selected areas can be accomplished easily by jet electropolishing. For such applications it is necessary that an oxide mask on one side of the wafer be aligned with one on the other side. Each mask will comprise a non-doped oxide having openings therein through which a dopant can be thereafter diffused.

The phenomenon of illumination as a necessary condition for oxide growth on N-type silicon wafers is made use of in the present invention. In this respect, the invention resides in the discovery that identical oxide masks can be grown on opposite sides of a wafer of N-type silicon immersed in a suitable electrolyte by impinging a beam of white light containing the near infrared wavelengths (0.7–1.1 microns) light on a single side of the wafer only. Instead of white light the near infrared can also be used by itself. Surprisingly enough, such an arrangement causes the growth of identical and aligned oxide layers on both sides of the wafer, assuming that the resistivity of the wafer is at least 5 ohms per square centimeter or higher. These aligned oxide masks may be used, for example, for the purpose of diffusing P-type emitters and collectors into opposite sides of the wafer. The simultaneous growth of identical oxide masks on opposite sides of the silicon wafer is due to the fact that the short wavelengths of the polychromatic light, strongly absorbed by the silicon, utilized to grow the oxide layer on the side of the wafer on which the light beam is incident. The longer wavelengths, being capable of passing through the wafer, are utilized for oxide growth on the opposite side.

From the foregoing, it will be appreciated that as one object, the present invention provides a method for simultaneously forming anodic oxide layers on opposite sides of an N-type silicon wafer.

As another object, the present invention provides a method for simultaneously growing aligned oxide masks on opposite sides of a semiconductor wafer.

A further object of the invention is to provide a method for diffusing P-type impurities into opposite sides of a wafer of N-type silicon at a plurality of aligned locations to thereby form a plurality of P-N-P transistors on the single wafer.

Still another object of the invention is to provide a semiconductor device characterized in having preferably aligned P-type zones diffused into opposite sides of an N-type silicon wafer.

The above and other objects and features of the invention will become apparent from the following detailed description taken in connection with the accompanying drawings which form a part of this specification, and in which.

Figures 1, 2:
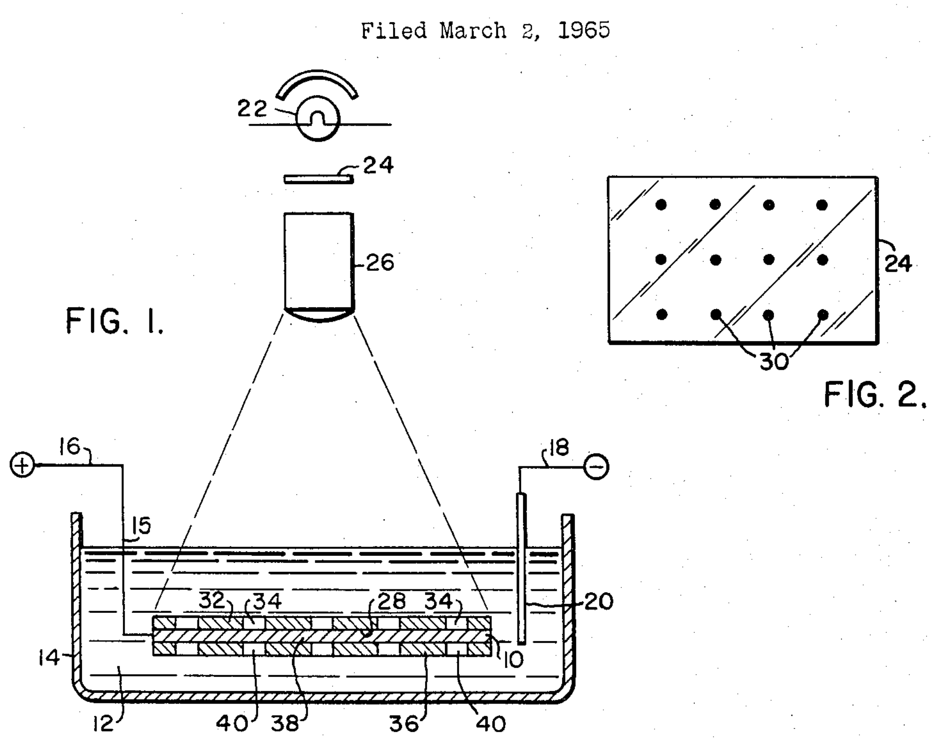
FIGURE 1 is a schematic illustration of the overall method of the invention.
FIG. 2 is a plan view of the optical mask utilized to produce the desired oxide pattern on an N-type silicon wafer in the apparatus of FIG. 1.

With reference now to the drawings, and particularly to FIG. 1, an N-type silicon wafer 10 is shown immersed within an electrolytic bath 12 contained within a tank 14. The wafer 10 is connected, as shown, to the positive terminal 16 of a direct current voltage source, not shown, while the negative terminal 18 of this same source is connected to an inert electrode 20 of platinum or the like depending downwardly into the bath 12. The lead 15 connecting the wafer 10 to terminal 16 must itself be insulated from contact with the electrolyte in anyone of a number of well-known ways.

The electrolyte 12 preferably comprises a solution of potassium nitrite in tetrahydrofurfuryl alcohol. However, any electrolyte may be utilized which will facilitate oxide growth on the surface of the wafer 10, such as ammonium pentaborate in aqueous solution.

As it was mentioned above, it is a characteristic of N-type silicon wafers that the growth of anodic oxide films thereon depends upon the availability of minority carriers at the surface of the wafer. Therefore, no appreciable oxide growth will occur in complete darkness below the breakdown strength of the silicon electrolyte surface barrier, provided the surface recombination-regeneration velocity is low.

In order to grow an oxide layer on the surface of the wafer 10, therefore, it must be illuminated; and such illumination is provided in accordance with the present invention by means of a source of polychromatic light supplied, for example, by a conventional incandescent lamp 22. The light from lamp 22 passes through a mask 24 and a lens system 26 onto the upper surface 28 of the N-type silicon wafer 10. Remembering that anodic oxide growth will not occur on N-type silicon wafers in the absence of external illumination, it will be appreciated that by blocking light from selected areas of the wafer 10, an oxide mask of a predetermined configuration can be achieved. For example, the mask 24 may appear as in FIG. 2 wherein the entire mask is transparent except for small circular areas 30 which will cast shadows onto the surface of the wafer 10. The result, of course, is that an oxide layer 32 will grow on the upper surface 28 except in those areas 34 from which light is blocked by the opaque areas 30 on the mask 24. As will be appreciated, the areas 30 comprise windows in the oxide mask 32 which may be used in a subsequent operation As another object, the present invention provides a method for simultaneously growing aligned oxide masks for selective diffusion of a P-type dopant into the N-type silicon wafer 10.

In accordance with the present invention, it has been found that in addition to the oxide mask 32 grown on the upper surface 28, a second oxide mask 36 will also grow on the lower surface 38, provided only that the resistivity of the wafer 10 is 5 ohms per square centimeter or higher. Furthermore, the geometry of the lower oxide mask 36 will be identical to that of the upper mask 32, having openings 40 therein which are aligned with the openings 34 in the upper mask. As mentioned above, this is due to the fact that the shorter wavelengths from source 22, (i.e., 0.3 to 0.7 micron) being strongly absorbed by the silicon, will be utilized for growth of the oxide film on the upper side of the wafer 10, while the long wavelengths (i.e., 0.7 to 1.1 microns) from the source 22 will be utilized for growing the film 36 on the other side.

Since the minority carriers (i.e., holes) propagating to the back surface of the wafer are also diffusing sideways, though only for very small distances due to the thinness of the wafer 10, the oxide pattern generated on the lower surface 38 is slightly wider than the pattern generated on the front surface. In this respect, a light spot on the front surface of the wafer 10 will result in a slightly larger oxide spot on the back surface as compared to the front surface. Inversely, a dark spot in the light pattern on the front surface will become somewhat smaller on the back surface as compared to the front surface. The result in the specific illustration given in FIG. 1, of course, is that the windows or openings 40 in the oxide mask 36 will be somewhat smaller than the windows 34 in the other oxide mask 32.

The thickness of the wafer 10 is preferably about 0.75 to 1.25 mils if the wafer is to be used without additional processing. However, the initial thickness of the wafer may be increased if areas of reduced thickness are produced by jet electropolishing. In this latter case, the ability of the longer wavelengthe to pass through the remaining thickness in the pits produced by electropolishing is the important factor. For device purposes this remaining thickness should again be about 1 mil.

Figure 3:
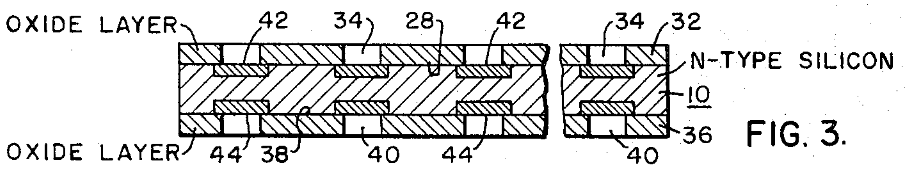
FIG. 3 is a cross-sectional view depicting the structure of an oxide-coated N-type silicon wafer after diffusion to form P-N junctions therein.
Figure 4:
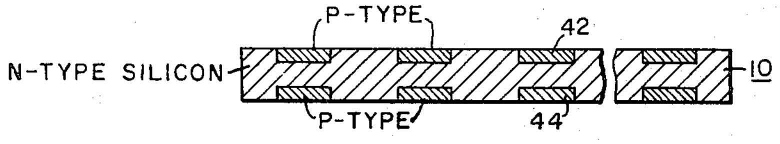
FIG. 4 is a cross-sectional view depicting the completed semiconductor wafer after etching to remove the oxide layer.

Following formation of the oxide masks 32 and 36, the N-type silicon wafer 10 may be subjected to conventional vapor diffusion techniques to diffuse P-type regions into the opposite sides of the wafer through openings or windows 34 and 40. Thus, as shown in FIG. 3, the diffusion process will produce P-type regions 42 and 44 on opposite sides of the central N-type region of the wafer 10. The result, of course, is that a plurality of P-N-P transistors are formed over the area of wafer 10. While the P-type regions 42 and 44 may be formed by conventional vapor diffusion techniques, they may also be formed by growing P-type doped anodic oxide films on the exposed areas of wafer 10, followed by heating to diffuse the dopant within the oxide layer into the N-type wafer 10. If anodic oxide diffusion techniques are employed, the doped anodic oxide layer is preferably encapsulated within an outer non-doped anodic oxide layer grown in accordance with the teachings of application Ser. No. 431,907 filed Feb. 11, 1965, now abandoned and assinged to the assignee of the present application.

The following examples are illustrative of the teachings of the invention.

Example I

An N-type silicon disc, ¾ inch in diameter, and having a thickness of 20 mils, was etched in a solution consisting of one part hydrofluoric acid and three parts nitric acid. The silicon used had a resistivity of about 24 ohms per square centimeter.

Following the initial etching operation, the wafer was immersed in an electrolyte consisting of ammonium pentaborate in aqueous solution, the temperature of the electrolyte being 25° C. The wafer was connected to the positive terminal of a direct current voltage source, the negative terminal of which was connected to a platinum electrode immersed within the electrolyte.

The upper surface of the silicon disc was illuminated by means of an optical system similar to that shown in FIG. 1 of the drawings in which polychromatic light passes through an optical mask to produce a pattern of light and dark areas on the upper side. The other or bottom side of the disc was not illuminated. A current density of about 10 milliamperes per square centimeter was established in the area of the pattern produced by illumination until the forming voltage reached 70 volts. At this point, it was found that oxide films formed on both sides of the wafer, each oxide film being about 600 Angstrom units in thickness and geometrically defining the pattern established by the mask through which the illuminating light passed.

Following formation of the identical oxide masks, boron was diffused by conventional vapor techniques into the exposed areas of the N-type silicon to form a plurality of P-N-P transistor structures, the N-type wafer acting as a common base.

Example II

An N-type silicon web, about 1 centimeter in width and 3 mils thick, was again etched in a solution consisting of one part hydrofluoric acid and three parts nitric acid. The silicon used in this example had a resistivity in the range of about 25 to 30 ohms per square centimeter.

Following etching, the web was immersed in an electrolyte consisting of potassium nitrite and tetrahydrofurfuryl alcohol at a temperature of about 25° C. A current density of about 10 milliamperes per square centimeter was established until the forming voltage reached 100 volts. The upper surface of the web was illuminated through a suitable optical mask to produce a pattern of light and dark areas on the upper surface. Upon reaching a forming voltage of 100 volts, identical oxide masks were formed on the upper and lower surfaces of the disc, each oxide layer having a thickness of about 600 Angstrom units and being non-porous.

Vapor diffusion followed as in Example I given above.

Example III

An N-type silicon web 4 mils thick, was processed in the same manner as recited above in connection with Example II, except that only the lower surface of the web was immersed in the electrolyte. When the upper surface was illuminated through a suitable optical mask to produce a pattern of light and dark areas, an oxide film of about 600 Angstrom units was formed at a forming voltage of 100 volts on the lower surface by the longer wavelengths passing through the web. No oxide mask was grown on the upper surface for the obvious reason that it was not immersed in the electrolyte.

Although the invention has been described in connection with certain specific embodiments, it will be readily apparent to those skilled in the art that various changes may be made to suit requirements without departing from the spirit and scope of the invention.

We claim as our invention:

1. In the process for forming oxide coatings on opposite sides of an N-type silicon wafer, the steps of immersing the wafer in an electrolyte capable of forming an anodic oxide layer thereon, applying an anodizing potential between the wafer and an inert electrode extending into the electrolyte, and subjecting only one side of the wafer to a beam of white light containing near infrared wavelengths whereby the short wavelengths of the light beam will cause the formation of an oxide film on the side of the wafer on which the light beam is incident while the longer wavelengths will pass through the wafer to form an oxide coating on the opposite side.

2. The process of claim 1 wherein the thickness of the area of the wafer exposed to light is in the range of about 0.75 to 1.25 mils.

3. In the process for forming oxide coatings on opposite sides of an N-type silicon web, the steps of immersing a web having a thickness in the range of about 0.75 to 1.25 mils and a resistivity of at least 5 ohms per square centimeter in an electrolyte capable of forming an anodic oxide layer thereon, applying an anodizing potential between the web and an inert electrode extending into the electrolyte, and subjecting only one side of the web to a beam of polychromatic light whereby the short wavelengths of the light beam will cause the formation of an oxide film on the side of the web on which the light beam is incident while the longer wavelengths will pass through the wafer to form an oxide coating on the opposite side.

4. The process of claim 3 wherein the electrolyte comprises ammonium pentaborate in aqueous solution.

5. The process of claim 3 wherein the electrolyte comprises a mixture of potassium nitrite and tetrahydrofurfuryl alcohol.

6. In the process for forming aligned oxide masks on opposite sides of an N-type silicon wafer, the steps of immersing the wafer in an electrolyte capable of forming an anodic oxide layer thereon, passing polychromatic light through an optical mask and onto one side of the wafer immersed within said electrolyte whereby a visible pattern of light and dark areas will be produced on said one side of the wafer but not on the other side, and applying an anodizing potential between the wafer and an inert electrode extending into the electrolyte whereby the short wavelengths of the polychromatic light will cause the formation of an oxide film on the side of the wafer on which the light beam is incident while the longer wavelengths will pass through the wafer to form an oxide film on the opposite side, each of said oxide films defining a pattern corresponding to the visible light areas produced by the polychromatic light passing through said optical mask and each oxide pattern being aligned on opposite sides of the wafer.

7. In the manufacture of an N-type silicon wafer having a plurality of aligned P-type regions diffused into opposite sides thereof, the steps of immersing a wafer of N-type silicon in an electrolyte capable of forming an anodic oxide layer thereon, passing a beam of polychromatic light through a transparent optical mask having a plurality of opaque areas thereon and focusing the light passing through the optical mask onto one side of the wafer whereby said one side of the wafer will be illuminated except at the dark areas produced by said opaque areas of the optical mask, applying an anodizing potential between the wafer and an inert electrode extending into the electrolyte whereby the short wavelengths of the light beam will cause the formation of an oxide film on the side of the wafer on which the light beam is incident while the longer wavelengths will pass through the wafer to form an oxide film on the opposite side, each of said oxide films covering the opposite sides of the wafer entirely except at said dark areas to provide aligned windows in the oxide films on opposite sides of the wafer, and in a diffusion process diffusing a P-type dopant through said aligned windows to form a plurality of P-N-P transistor configurations in said wafer.

8. A semiconductor device produced by the method of claim 7.

References Cited

UNITED STATES PATENTS

| | | | |
|---|---|---|---|
| 2,909,470 | 10/1959 | Schmidt | 204—14 |
| 2,995,475 | 8/1961 | Levi | 204—32 |
| 3,010,885 | 11/1961 | Schink | 204—32 |
| 3,324,015 | 6/1967 | Saia et al. | 204—15 |
| 3,345,274 | 10/1967 | Schmidt | 204—15 |
| 3,345,275 | 10/1967 | Schmidt | 204—15 |

HOWARD S. WILLIAMS, *Primary Examiner.*

T. TUFARIELLO, *Assistant Examiner.*